(12) United States Patent
Pavelchek et al.

(10) Patent No.: US 6,855,466 B2
(45) Date of Patent: *Feb. 15, 2005

(54) PLANARIZING ANTIREFLECTIVE COATING COMPOSITIONS

(75) Inventors: Edward K. Pavelchek, Stow, MA (US); Timothy G. Adams, Sudbury, MA (US); Manuel doCanto, Stoughton, MA (US); Suzanne Coley, Mansfield, MA (US); George G. Barclay, Jefferson, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/952,880

(22) Filed: Sep. 15, 2001

(65) Prior Publication Data

US 2002/0022196 A1 Feb. 21, 2002

Related U.S. Application Data

(62) Division of application No. 09/264,061, filed on Mar. 8, 1999, now Pat. No. 6,316,165.

(51) Int. Cl.[7] ................................................. G03F 7/00
(52) U.S. Cl. ............................... 430/14; 430/9; 430/18; 430/290; 430/950
(58) Field of Search .................. 430/9, 14, 18, 430/290, 950, 311

(56) References Cited

U.S. PATENT DOCUMENTS

| | | | |
|---|---|---|---|
| 4,060,656 A | 11/1977 | Naka et al. | 428/355 |
| 4,362,809 A | 12/1982 | Chen et al. | 430/312 |
| 4,370,405 A | 1/1983 | O'Toole et al. | 430/312 |
| 4,621,042 A | 11/1986 | Pampalone et al. | 430/271.1 |
| 4,668,606 A | 5/1987 | DoMinh et al. | 430/271.1 |
| 4,910,122 A * | 3/1990 | Arnold et al. | 430/313 |
| 5,234,990 A | 8/1993 | Flaim et al. | 524/609 |
| 5,368,989 A | 11/1994 | Flaim et al. | 430/271.1 |
| 5,498,748 A | 3/1996 | Urano et al. | 560/67 |
| 5,541,037 A | 7/1996 | Hatakeyama et al. | 430/273.1 |
| 5,554,485 A | 9/1996 | Dichiara et al. | 430/271.1 |
| 5,597,868 A | 1/1997 | Kunz | 525/154 |
| 5,607,824 A | 3/1997 | Fahey et al. | 430/510 |
| 5,624,789 A | 4/1997 | Rahman et al. | 430/311 |
| 5,652,297 A | 7/1997 | McCulloch et al. | 524/555 |
| 5,652,317 A * | 7/1997 | McCulloch et al. | 526/312 |
| 5,693,691 A | 12/1997 | Flaim et al. | 523/436 |
| 5,733,714 A * | 3/1998 | McCulloch et al. | 430/325 |
| 5,736,301 A | 4/1998 | Fahey et al. | 430/325 |
| 5,741,626 A | 4/1998 | Hain et al. | 430/314 |

(List continued on next page.)

FOREIGN PATENT DOCUMENTS

| | | |
|---|---|---|
| EP | 0 542 008 A1 | 5/1993 |
| EP | 0 861 855 A | 9/1998 |
| EP | 0 987 600 A | 3/2000 |
| EP | 0 989 463 A | 3/2000 |
| WO | WO 90/03598 | 4/1990 |
| WO | WO 99 21058 A | 4/1999 |

*Primary Examiner*—Mark F. Huff
*Assistant Examiner*—Nicole Barreca
(74) *Attorney, Agent, or Firm*—Peter F. Corless; Darryl P. Frickey; Edwards & Angell, LLP

(57) ABSTRACT

The present invention provides new light absorbing compositions suitable for use as antireflective coating compositions ("ARCs"), including for deep UV applications. The antireflective compositions of the invention are particularly useful where a planarizing coating layer is required. ARCs of the invention contain a low molecular weight resin, a plasticizer compound and/or a low Tg resin. The invention also includes methods for applying forming planarizing ARC coating layers.

18 Claims, 1 Drawing Sheet

U.S. PATENT DOCUMENTS

| | | | |
|---|---|---|---|
| 5,744,293 A | | 4/1998 | Okumura et al. ............ 430/512 |
| 5,783,361 A | | 7/1998 | Conley et al. ............ 430/271.1 |
| 5,851,730 A | * | 12/1998 | Thackeray et al. ...... 430/271.1 |
| 5,858,627 A | * | 1/1999 | Rahman et al. ............. 430/326 |
| 5,886,102 A | * | 3/1999 | Sinta et al. ................. 525/154 |
| 5,919,599 A | | 7/1999 | Meador et al. .......... 430/271.1 |
| 5,935,760 A | * | 8/1999 | Shao et al. .............. 430/270.1 |
| 6,033,830 A | | 3/2000 | Sinta et al. ................. 430/325 |
| 6,106,995 A | * | 8/2000 | Dixit et al. .............. 430/270.1 |
| 6,114,085 A | * | 9/2000 | Padmanaban et al. ... 430/270.1 |
| 6,268,108 B1 | * | 7/2001 | Iguchi et al. ............ 430/271.1 |
| 6,339,112 B1 | * | 1/2002 | Kauffman et al. ............ 522/95 |
| 6,391,786 B1 | * | 5/2002 | Hung et al. ................. 438/706 |
| 6,410,209 B1 | * | 6/2002 | Adams et al. .............. 430/311 |
| 6,468,718 B1 | * | 10/2002 | Kang et al. .............. 430/281.1 |
| 2002/0022196 A1 | * | 2/2002 | Pavelchek et al. .......... 430/311 |
| 2002/0031729 A1 | * | 3/2002 | Trefonas et al. ............ 430/322 |

* cited by examiner

PLANARIZING ANTIREFLECTIVE COATING COMPOSITIONS

This application is a Divisional of 09/264,061, filed Mar. 8, 1999, now U.S. Pat. No. 6,316,165.

BACKGROUND OF THE INVENTION

1. Field of the Invention

The present invention relates to compositions that reduce reflection of exposing radiation from a substrate back into an overcoated photoresist layer. More particularly, the invention relates to antireflective coating compositions that can be applied as coating layers that are planarizing with respect to an underlying substrate.

2. Background Art

Photoresists are photosensitive films used for transfer of an image to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist coated substrate. Following exposure, the photoresist is developed to provide a relief image that permits selective processing of a substrate. Photoresist compositions in general are known to the art and described e.g. by Deforest, *Photoresist Materials and Processes*, McGraw Hill Book Company, New York, ch. 2, 1975 and by Moreau, *Semiconductor Lithography, Principles, Practices and Materials*, Plenum Press, New York, ch. 2 and 4.

A major use of photoresists is in semiconductor manufacture where an object is to convert a highly polished semiconductor slice, such as silicon or gallium arsenide, into a complex matrix of electron conducting paths, preferably of micron or submicron geometry, that perform circuit functions. Proper photoresist processing is a key to attaining this object. While there is a strong interdependency among the various photoresist processing steps, exposure is believed to be one of the more important steps in attaining high resolution photoresist images.

Reflection of activating radiation used to expose a photoresist often poses limits on resolution of the image patterned in the photoresist layer. Reflection of radiation from the substrate/photoresist interface can produce spatial variations in the radiation intensity in the photoresist, resulting in non-uniform photoresist linewidth upon development. Radiation also can scatter from the substrate/photoresist interface into regions of the photoresist where exposure is not intended, again resulting in linewidth variations. The amount of scattering and reflection will typically vary from region to region, resulting in further linewidth non-uniformity. Variations in substrate topography also can give rise to resolution-limiting reflection problems.

It thus would be desirable to have new antireflective coating compositions.

SUMMARY OF THE INVENTION

We have found that antireflective coatings generally function optimally at a quarter wave thicknesses over a reflective surface. Accordingly, in many instances, conformal antireflective coatings will be preferred.

However, in certain applications, a conformal coating will be less preferred. For example, where wafer or other substrate topography has vertical steps, the desired quarter wave coating layer thickness can not be maintained. In that situation, use of a planarizing antireflective coating composition will be preferred as it will enable of no variation of resist thickness over the vertical step feature. Such uniform resist thickness will minimize CD variations and potentially enhance available depth of focus by placing all of the resist at the same height. Moreover, use of a planarizing ARC over such topographies enables relatively uniform exposure to the etch process, rather than having the trench center exposing to the antireflective etch during clearing of the sidewalls.

The present invention provides new radiation absorbing compositions suitable for use as antireflective coating compositions ("ARCs") with photoresist compositions. The ARCs of the invention can be highly planarizing and thus will be useful in applications such as those described above.

In a first aspect of the invention, antireflective compositions are provided that comprise a resin binder component that contains a relatively low molecular weight polymer, e.g. a polymer having an $M_w$ of about 8,000 daltons or less, more preferably an $M_w$ of about 7,000, 6,000 or 5,000 daltons or less. Polymers or oligomers having a $M_w$ of about 4,000, 3000 or 2,000 daltons or less also will be useful in the planarizing ARCs of the invention. Generally, in this aspect of the invention, the low molecular weight resin will have a $M_w$ of at least about 1,000 or 1,500 daltons. Resins containing acrylate units are often preferred.

It has been found that ARCs of the invention with such low molecular weight resin components can exhibit good planarizing properties upon application to a substrate surface. For example, ARCs of the invention can coat substantial topography such as vertical and sloping steps quite to provide a uniform, planar surface thereover.

In a further aspect of the invention, planarizing ARCs are provided that comprise a relatively low molecular weight plasticizer compound. Preferred plasticizer compounds of ARC compositions of the invention include non-polymeric compounds, although various oligomers also can be employed. Plasticizers for use in the ARCs of the invention typically have a molecular weight of about less than 2,000 or 1,500 daltons, more preferably a molecular weight of less than about 1,000, 800 or 500 daltons. Preferred plasticizers also have sufficient molecular weight to be relatively non-volatile during lithographic processing, e.g. a molecular weight of at least about 150 or 200 daltons, and/or having a boiling point in excess of about 160° C., more preferably in excess of about 180° C. or about 200° C.

For example, suitable plasticizers include anthracene compounds, particularly phenyl or benzyl substituted compounds, e.g. 9-(2',4'-dihydroxy-3-methylbenzyl) anthracene; compounds having multiple aryl substitution, particularly multiple phenyl or other carbocyclic aryl substitution such as (3-hydroxypheny;)[bis(3-cyclohexyl-4-hydroxy-6-methylphy;)]methane; phenolic compounds that may have additional carbocyclic aryl substitution such as 2,6-bis(2',4'-dihydroxybenzyl)4-methylphenol; alkyl phthalate compounds such as di($C_2$-$C_{16}$alkyl) phthalate compounds e.g. dioctyl phthalate; and the like. Exemplary oligomers include acrylate oligomers such as oligomers of ethylacrylate/glycidyl acrylate, and the like.

It has been found that ARCs of the invention that contain such a plasticizer compound can exhibit good planarizing properties upon application to a substrate surface, including substrate surface with significant topography such as vertical and sloping steps.

Planarizing ARCs are also provided that combine both such aspects of the invention, i.e. that contain a low molecular weight resin as well as a plasticizer compound.

Crosslinking ARCs of the invention are often preferred. In a crosslinking system, one or more components are capable of some type of reaction that crosslinks or otherwise hardens the applied ARC coating layer. Such crosslinking-type compositions preferably comprise an acid or acid generator compound (e.g. a thermal acid generator) to induce or promote such crosslinking of one or more components of the ARC. Generally preferred crosslinking antireflective compositions comprise a separate crosslinker component such as an amine-based material. The invention also includes antireflective compositions that do not undergo significant cross-linking during intended use with a photoresist composition.

In yet further aspect of the invention, methods for provided for application of planarizing ARC compositions. These methods in general include application of an ARC composition on a substrate, heating the applied ARC coating layer to provide flow of the composition and hence enhanced planarization. The photoresist then can be applied over the ARC layer.

In these methods, if the ARC composition is a crosslinking composition, the flow temperature should be below a temperature that may induce signficant crosslinking of the ARC composition. For example, such a planarizing crosslinking-type ARC can comprise a resin that has a glass transition temperature (Tg) below a temperature that will induce substantial crosslinking of the ARC composition. With such ARCs, the applied ARC can be heated to about the resin Tg, which causes the ARC composition to flow and achieve an enhanced level of planarization, but without significant crosslinking of the composition. Thereafter, the ARC composition can be further heated at a temperature above the resin Tg to induce significant crosslinking. Preferably, the ARC resin Tg will be at least about about 10° C., 15° C. or 20° C. below the temperature that induces significant crosslinking of the ARC composition, more preferably the ARC resin Tg will be at least about 25° C., 30° C., 35° C. or 40° C. below the temperature that induces significant crosslinking of the ARC composition. Low Tg resins that contain acrylate units are often preferred. References herein to "temperature where significant crosslinking of an ARC composition occurs", or other similar terminology, is defined to mean a temperature where upon 60 second exposure to the temperature at least about 20 mole percent of crosslinker component of the ARC composition has reacted.

ARCs with such low Tg resins can be provided by a number of strategies. For example, an ARC resin can be employed that comprises polymerized units of relatively "flexible" monomers that can reduce the resin's Tg. Exemplary flexible monomers include diethylene glycol methacrylate and diethylene glycol acrylate and corresponding lower alkyl (e.g. $C_{1-4}$) ethers, particularly methyl esters such as $CH_2=C(CH_3)C(O)OCH_2CH_2OCH_3$, $CH_2=CHC(O)OCH_2CH_2OCH_3$, $CH_2=CHC(O)OCH_2CH_2OCH_2CH_2OCH_3$, $CH_2=C(CH_3)C(O)OCH_2CH_2OCH_2CH_2OCH_3$, and the like; ethylene glycol methacrylate and ethylene glycol acrylate; alkyl arylates having 4 or more carbons, typically 4 to about 16 carbons, n-butyl acrylate; and hydroxy alkyl methacrylate or acrylate, where the hydroxyalkyl substituent has 4 to about 16 carbon atoms; and the like.

Such temperature differentiation between ARC composition flow and crosslinking can be provided by several different strategies. In a preferred approach, the ARC composition crosslinks in the presence of acid, and the composition contains a thermal acid generator that will produce an acid only upon exposure to a relatively high temperature that is above the Tg of the resin ARC. For example, preferred thermal acid generators fur use in this aspect of the invention will be activated (generate acid) upon extended (e.g. at least 30 seconds) exposure to at least about 70° C. or 80° C., more preferably at least about 90° C. or 100° C., still more preferably at least about 110° C. or 120° C.

The invention also includes ARC compositions that have such low Tg resins as well as one or both of the other aspects of the invention discussed above, i.e. a low molecular weight resin and/or a plasticizer compound.

Antireflective compositions of the invention are suitably used with either positive-acting and negative-acting photoresist compositions.

The invention further provides methods for forming a photoresist relief image and novel articles of manufacture comprising substrates coated with an antireflective composition of the invention alone or in combination with a photoresist composition. Typical substrates coated with an antireflective composition of the invention include e.g. microelectronic wafers and flat panel display substrates such as liquid crystal display substrates. Other aspects of the invention are disclosed infra.

DETAILED DESCRIPTION OF THE INVENTION

Figure 1:
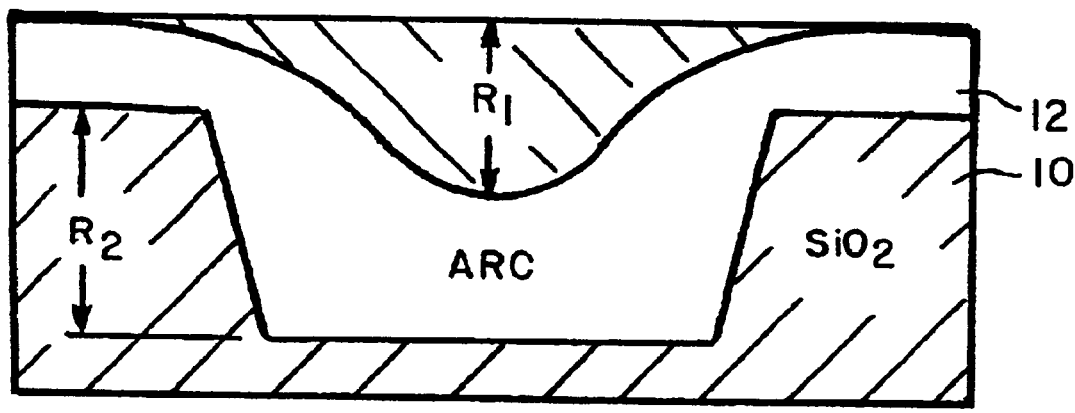
FIG. 1 shows a schematic for determination of degree of planarization of an ARC.

As stated above, in a first aspect, antireflective compositions of the invention comprise a low molecular weight polymer. The low molecular weight polymer composition is capable of providing a highly planarizing coating.

One measure of a coating layer's planarity is referred to as the "degree of planarity" or "DOP", which is defined herein for a given step topography as follows:

$$DOP=1-R_1/R_2$$

where $R_1$ is the maximum "dimple depth" of the ARC composition over the step feature, and $R_2$ is the step depth. That relationship to calculate DOP is further shown in FIG. 1 of the drawings which depicts substrate 10 have a sloping step (such as may be formed by local oxidation of silicon procedure) and an ARC layer 12. In that FIGURE, one minus the quotient of the depicted values of $R_1$ and $R_2$ is equal to the DOP for the coating. The term "degree of planarity" or "DOP" as used herein refers to that value of 1 minus ($R_1$ divided by $R_2$) as discussed above and exemplified in FIG. 1.

Preferred ARCs of the invention exhibit a DOP of at least about 0.5 for a step feature having a sloping profile formed by a local oxidation of silicon (LOCOS) procedfure and a 0.8 micron wifth and 2 micron mid-point depth, more preferably a DOP of at least about 0.55 or 0.60 for such a feature, still more preferably a DOP of about 0.65 for such a feature.

As discussed above, in a first aspect of the invention, planarizing ARCs are provided that contains a low Mw resin. A wide variety of materials may be used as a low molecular polymer in the ARCs. The low molecular polymer preferably exhibits suitable characteristics for use in the intended applications, particularly that the polymer is capable of being dissolved in a selected solvent.

For crosslinking ARCs of the invention, the polymer may suitably contain sites for reaction with other composition component(s) to effect crosslinking, although other ARC components could function as crosslinking species such as another polymer.

For deep UV applications, a polymer of the antireflective composition preferably will effectively absorb reflections in the deep UV range (typically from about 100 to 300 nm). Thus, the polymer preferably contains units that are deep UV chromophores, i.e. units that absorb deep UV radiation. Highly conjugated moieties are generally suitable chromophores. Aromatic groups, particularly polycyclic hydrocarbon or heterocyclic units, are typically preferred deep UV chromophores, e.g. groups having from two to three or four fused or separate rings with 3 to 8 ring members in each ring and zero to three N, O or S atoms per ring. Such chromophores include substituted and unsubstituted phenanthryl, substituted and unsubstituted anthracyl, substituted and unsubstituted acridine, substituted and unsubstituted naphthyl, substituted and unsubstituted quinolinyl and ring-substituted quinolinyls such as hydroxyquinolinyl groups. Substituted or unsubstituted anthracyl groups are particularly preferred. Preferred resin binders have pendant anthracene groups. Preferred resins include those of Formula I as disclosed on page 4 of European Published Application 813114A2 of the Shipley Company.

Another preferred resin binder comprises substituted or unsubstituted quinolinyl or a quinolinyl derivative that has one or more N, O or S ring atoms such as a hydroxyquinolinyl. The polymer may contain other units such as carboxy and/or alkyl ester units pendant from the polymer backbone. A particularly preferred antireflective composition resin is an acrylic polymer containing such units, such as the resins of Formula II disclosed on pages 4–5 of European Published Application 813114A2 of the Shipley Company.

For imaging at 193 nm, the ARC composition preferably will contain a resin that has phenyl chromophore units. For instance, one preferred ARC resin for use with photoresists imaged at 193 nm is a terpolymer consisting of polymerized units of styrene, 2-hydroxyethylmethacrylate and methylmethacrylate (30:38:32 mole ratio). Such phenyl resins and use of same in ARC compositions have been disclosed in U.S. application Ser. No. 09/153,575, filed Sep. 15, 1998, and assigned to the Shipley Company.

Low molecular weight resin of antireflective compositions of the invention are preferably synthesized by polymerizing two or more different monomers where at least one of the monomers includes a chromophore group, e.g. an anthracenyl, quinolinyl or hydroxyquinolinyl group. A free radical polymerization is suitably employed, e.g., by reaction of a plurality of monomers to provide the various units in the presence of a radical initiator preferably under an inert atmosphere (e.g., $N_2$ or argon) and at elevated temperatures such as about 50° C. or greater, although reaction temperatures may vary depending on the reactivity of the particular reagents employed and the boiling point of the reaction solvent (if a solvent is employed). A variety of reaction solvents can be employed such as propanols and butanols and aromatic solvents such as benzene, chlorobenzene, toluene and xylene. Dimethylsulfoxide, dimethylformamide, propylene glycol monomethyl ether, ethyl lactate and THF are also suitable. The solvent is preferably degassed before addition of reagents. A chain transfer agent such as t-dodecylthiol also may be employed. Suitable reaction temperatures for any particular system can be readily determined empirically by those skilled in the art based on the present disclosure. A variety of free radical initiators may be employed to prepare the copolymers of the invention. For example, azo compounds may be employed such as 2,2'-azobis(2-methylbutanenitrile), 2,2'-azobis(2,4-dimethylpentanenitrile), azo-bis-2,2'-isobutyronitrile (AIBN) and 1,1'-azobis (cyclohexanecarbonitrile). Peroxides, peresters, peracids and persulfates also can be employed. See Examples 1–4 which follow for exemplary reaction conditions.

Also, while less preferred, a preformed resin may be functionalized with chromophore units. For example, a glycidyl phenolic resin such as a glycidyl novolac can be reacted with an anthranyl carboxylic acid.

Resins of antireflective compositions of the invention preferably exhibit good absorbance at deep UV wavelengths such as within the range of from 100 to about 300 nm. More specifically, preferred resin binders of the invention have optical densities of at least about 3 absorbance units per micron (Absorb. units/$\mu$) at the exposing wavelength utilized (e.g. about 248 nm or about 193 nm), preferably from about 5 to 20 or more absorbance units per micron at the exposing wavelength, more preferably from about 4 to 16 or more absorbance units per micron at the exposing wavelength utilized. Higher absorbance values for a particular resin can be obtained by increasing the percentage of chromophore units on the resin.

While antireflective composition resin having such absorbing chromophores are generally preferred, antireflective compositions of the invention may comprise other resins either as a co-resin or as the sole resin binder component. For example, phenolics, e.g. poly(vinylphenols) and novolaks, may be employed. Such resins are disclosed in European Application EP 542008 of the Shipley Company, and U.S. Pat. No. 5,851,738 to Thackeray et al. Other resins described below as photoresist resin binders also could be employed in resin binder components of antireflective compositions of the invention.

The concentration of the resin component of the antireflective compositions of the invention may vary within relatively broad ranges, and in general the resin binder is employed in a concentration of from about 50 to 95 weight percent of the total of the dry components of the antireflective composition, more typically from about 60 to 90 weight percent of the total dry components (all components except solvent carrier).

A variety of compounds can be employed as a plasticizer agent of antireflective compositions of the invention. A plasticizer material also may include an exposure radiation-absorbing chromophore if desired. For example, suitable plasticizers include anthracene compounds, particularly phenyl or benzyl substituted compounds, e.g. 9-(2',4'-dihydroxy-3-methylbenzyl)anthracene; compounds having multiple aryl substitution, particularly multiple phenyl or other carbocyclic aryl substitution such as (3-hydroxypheny;)[bis(3-cyclohexyl-4-hydroxy-6-methylpheny;)]methane; phenolic compounds that may have additional carbocyclic aryl substitution such as 2,6-bis(2',4'-dihydroxybenzyl)4-methylphenol; and the like. Non-polymeric plasticizers may be preferred in many applications. However, oligomeric plasticizers also may be employed as discussed above. Preferred oligomers include acrylate oligomers such as oligomers of ethylacrylate/glycidyl acrylate, and the like. In general, oligomeric plasticizers employed in ARC compositions of the invention will have about 2, 3, 4, 5, 6 or 7 linked units, more typically from about 2, 3 4 or 5 linked units. Oligomeric plasticizers of ARCs of the invention preferably will have a Mw of about 3000 or less, more preferably about 2,000 or 1,500 or less.

Some specifically preferred plasticizers for use in the ARCs of the invention include the following compounds 1 through 6, which includes the oligomers 4 through 6.

1

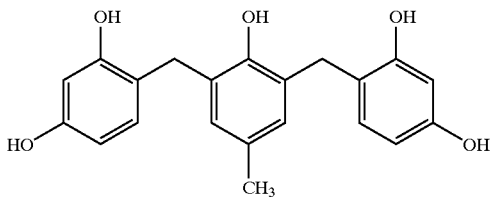

2

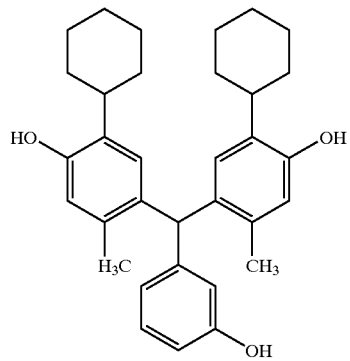

3

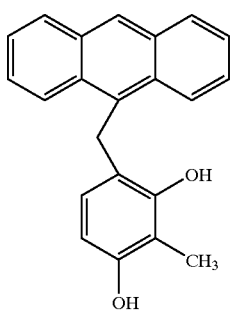

4

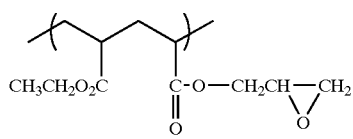

Avg. Mn = 1000

5

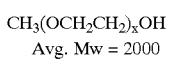

Avg. Mw = 2000

6

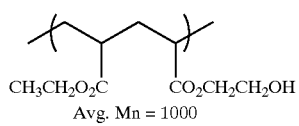

Avg. Mn = 1000

Plasticizer compounds preferably are present in an amounts from about 5 weight percent to about 50 weight percent, based on total solids (all components except solvent carrier) of an ARC composition, more preferably from about 10 to 30 or 40 weight percent of total solids of an ARC composition. Particularly preferred is a 20 weight percent loading of plasticizer based on total solids of an ARC composition.

ARCs of the invention that contain low Tg resins can be prepared generally as discussed above for the low Mw resins, with use of flexible monomers in the resin synthesis. See Examples 3 and 4 which follow for exemplary reaction conditions. The low Tg resin also can have a low $M_w$ as discussed herein. As discussed above, suitable "flexible" monomers include e.g. e diethylene glycol methacrylate and diethylene glycol acrylate; ethylene glycol methacrylate and ethylene glycol acrylate; alkyl arylates having 4 or more carbons, typically 4 to about 16 carbons, n-butyl acrylate; and hydroxy alkyl methacrylate or acrylate, where the hydroxyalkyl substituent has 4 to about 16 carbon atoms such as $CH_2=C(CH_3)COO(CH_2CH_2O)_4CH_2CH_2OH$ (that monomer known as "HEMA-5"); and the like.

Crosslinking-type antireflective compositions of the invention also generally contain a further crosslinker component. A variety of crosslinkers may be employed, including those antireflective composition crosslinkers disclosed in Shipley European Application 542008 incorporated herein by reference. For example, suitable antireflective composition crosslinkers include amine-based crosslinkers such as a melamine materials, including melamine resins such as manufactured by American Cyanamid and sold under the tradename of Cymel 300, 301, 303, 350, 370, 380, 1116 and 1130. Glycourils are particularly preferred including glycourils available from American Cyanamid. Benzoquanamines and urea-based materials also will be suitable including resins such as the benzoquanamine resins available from American Cyanamid under the name Cymel 1123 and 1125, and urea resins available from American Cyanamid under the names of Beetle 60, 65 and 80. In addition to being commercially available, such amine-based resins may be prepared e.g. by the reaction of acrylamide or methacrylamide copolymers with formaldehyde in an alcohol-containing solution, or alternatively by the copolymerization of N-alkoxymethyl acrylamide or methacrylamide with other suitable monomers.

Low basicity antireflective composition crosslinkers are particularly preferred such as a methoxy methylated glycouril. A specifically preferred crosslinker is a methoxy methylated glycouril corresponding to the following structure (III):

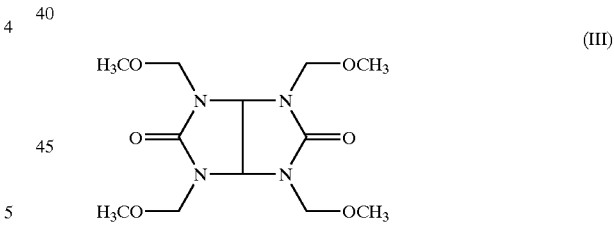

(III)

This methoxy methylated glycouril can be prepared by known procedures. The compound is also commercially available under the tradename of Powderlink 1174 from the American Cyanamid Co.

Other suitable low basicity crosslinkers include hydroxy compounds, particularly polyfunctional compounds such as phenyl or other aromatics having one or more hydroxy or hydroxy alkyl substituents such as a $C_{1-8}$ hydroxyalkyl substituents. Phenol compounds are generally preferred such as di-methanolphenol ($C_6H_3(CH_2OH)_2OH$) and other compounds having adjacent (within 1–2 ring atoms) hydroxy and hydroxyalkyl substitution, particularly phenyl or other aromatic compounds having one or more methanol or other hydroxylalkyl ring substituent and at least one hydroxy adjacent such hydroxyalkyl substituent.

It has been found that a low basicity crosslinker such as a methoxy methylated glycouril used in antireflective compositions of the invention can provide excellent lithographic performance properties, including significant reduction (SEM examination) of undercutting or footing of an overcoated photoresist relief image.

A crosslinker component of antireflective compositions of the invention in general is present in an amount of between 5 and 50 weight percent of total solids (all components except solvent carrier) of the antireflective composition, more typically in an amount of about 7 to 25 weight percent total solids.

Crosslinking antireflective compositions of the invention preferably further comprise an acid or acid generator compound, particularly a thermal acid generator compound, for catalyzing or promoting crosslinking during curing of an antireflective composition coating layer. Preferably a thermal acid generator is employed, i.e. a compound that generates acid upon thermal treatment. A variety of known thermal acid generators are suitably employed such as e.g. 2,4,4,6-tetrabromocyclohexadienone, benzoin tosylate, 4-nitrobenzyl tosylate and other alkyl esters of organic sulfonic acids. Compounds that generate a sulfonic acid upon activation are generally suitable. Typically a thermal acid generator is present in an antireflective composition in concentration of from about 0.1 to 10 percent by weight of the total of the dry components of the composition, more preferably about 2 percent by weight of the total dry components.

As discussed above, in the "multi-cure" methods of the inventions, where a lower flow thermal treatment is employed followed by a higher crosslinking treatment, a thermal acid generator is preferably employed that is activated (generates acid) at a relatively high temperature. Preferred high temperature activation thermal acid generators include arylsulfonic acid amine salts such as compounds of the following formula:

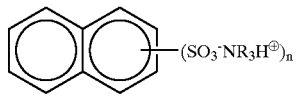

wherein each R independently may be hydrogen or alkyl having 1 to about 6 carbons, n is 1 or 2, and preferably is 2, and the naphthyl ring may be optionally substituted at available positions by e.g. alkyl having 1 to about 16 carbons and the like.

A particularly preferred thermal acid generator has the following general structure (R the same as defined above) and is commercially available under the tradename Nacure X49-110 by King Industries, Inc. of Norwalk, Conn. U.S.

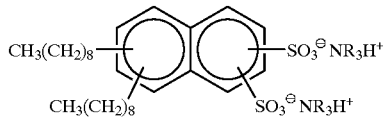

Also, rather than a thermal acid generator, an acid may be simply formulated into the antireflective composition, particularly for antireflective compositions that require heating to cure in the presence of acid so that the acid does not promote undesired reaction of composition components prior to use of the antireflective composition. Suitable acids include e.g. strong acids such as sulfonic acids e.g. toluene sulfonic acid, methane sulfonic acid, triflic acid, and the like, or mixtures of those materials.

The present invention also includes antireflective compositions that do not undergo significant cross-linking during intended use with a photoresist composition. Such non-crosslinking antireflective compositions need not include a crosslinker component or an acid or thermal acid generator for inducing or promoting a crosslinking reaction. In other words, such non-crosslinking antireflective compositions typically will be essentially free (i.e. less than about 1 or 2 weight percent) or completely free of a crosslinker component and/or acid surface for promoting a crosslinking reaction.

Antireflective compositions of the invention preferably also comprise one or more photoacid generators (i.e. "PAG") that are suitably employed in an amount sufficient to inhibit or substantially prevent undesired notching or footing of an overcoated photoresist layer. In this aspect of the invention, the photoacid generator is not used as an acid source for promoting a crosslinking reaction, and thus preferably the photoacid generator is not substantially activated during crosslinking of the antireflective composition (in the case of a crosslinking ARC). In particular, with respect to antireflective compositions that are thermally crosslinked, the antireflective composition PAG should be substantially stable to the conditions of the crosslinking reaction so that the PAG can be activated and generate acid during subsequent exposure of an overcoated resist layer. Specifically, preferred PAGs do not substantially decompose or otherwise degrade upon exposure of temperatures of from about 140 or 150 to 190° C. for 5 to 30 or more minutes. Such PAGs and the use thereof in antireflective coating compositions are disclosed in U.S. patent application Ser. No. 08/797,741, filed Feb. 6, 1997 of Pavelchek et al. and corresponding Japanese Patent Application No. 10-61845, both assigned to the Shipley Company.

For at least some antireflective compositions of the invention, antireflective composition photoacid generators will be preferred that can act as surfactants and congregate near the upper portion of the antireflective composition layer proximate to the antireflective composition/resist coating layers interface. Particularly preferred antireflective composition photoacid generators of the invention can be activated upon exposure to deep UV radiation, particularly about 248 nm, about 193 nm and/or about 157 nm, so that the antireflective composition can be effectively used with overcoated deep UV photoresists. Suitably the photoacid generator of the antireflective composition and the photoacid generator of the photoresist composition will be activated at the same exposure wavelength. It is further preferred that an antireflective composition of the invention is used together with a photoresist composition where the antireflective composition photoactive compound and photoresist photoactive compound generate the same or approximately the same acid compound (photoproduct) upon exposure to activating radiation during irradiation of the photoresist layer, i.e. photoproducts that preferably have similar diffusion characteristics and similar acid strengths. See the above-cited U.S. patent application Ser. No. 08/797,741 and Japanese Patent Application No. 10-61845.

Onium salts may be employed as photoacid generators of antireflective compositions of the invention. Examples of suitable preferred onium salts can be found in U.S. Pat. Nos. 4,442,197; 4,603,101; and 4,624,912, as well as the above-cited U.S. patent application Ser. No. 08/797,741 and Japanese Patent Application No. 10-61845.

Substituted dipehenyl iodonium camphor sulfonate compounds are preferred onium PAGs for antireflective compositions of the invention, particularly sulfonate salts. Two specifically preferred agents are the following PAGS 1 and 2:

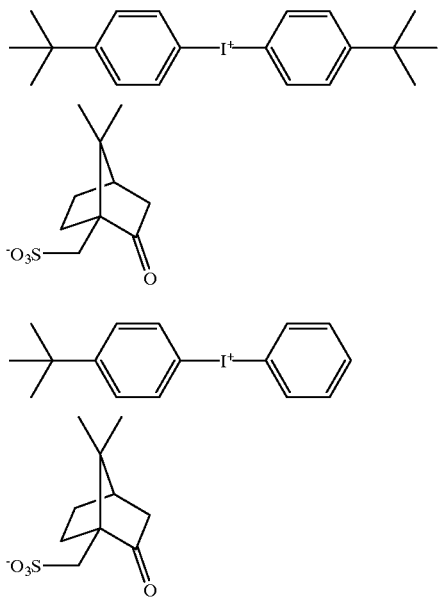

Such iodium compounds can be prepared as disclosed in European Patent Application 96118111.2 (publication number 0783136), which details the synthesis of above PAG 1.

Other suitable PAGS including sulfonated esters and sulfonyloxy ketones. See *J. of Photopolymer Science and Technology*, 4(3):337–340 (1991), for disclosure of suitable sulfonate PAGS, including benzoin tosylate, t-butylphenyl alpha-(p-toluenesulfonyloxy)-acetate and t-butyl alpha-(p-toluenesulfonyloxy)-acetate. Preferred sulfonate PAGs are also disclosed in U.S. Pat. No. 5,344,742 to Sinta et al.

Other useful acid generators for antireflective compositions of the invention include the family of nitrobenzyl esters, and the s-triazine derivatives. Suitable s-triazine acid generators are disclosed, for example, in U.S. Pat. No. 4,189,323.

Halogenated non-ionic, photoacid generating compounds also may be suitable for antireflective compositions of the invention such as, for example, 1,1-bis[p-chlorophenyl]-2,2,2-trichloroethane (DDT); 1,1-bis[p-methoxyphenyl]-2,2,2-trichloroethane; 1,2,5,6,9,10-hexabromocyclodecane; 1,10-dibromodecane; and the like. Suitable photoacid generators are also disclosed in European Patent Application Nos. 0164248 and 0232972; and in U.S. Pat. No. 5,362,600 to Sinta et al.

Antireflective compositions of the invention also may contain additional dye compounds that absorb radiation used to expose an overcoated photoresist layer. Other optional additives include surface leveling agents, for example, the leveling agent available under the tradename Silwet 7604 from Union Carbide, or the surfactant FC 171 or FC 431 available from the 3M Company.

ARCs of the invention can be prepared by generally known procedures. To make a liquid coating composition, the components of the antireflective composition are dissolved in a suitable solvent such as, for example, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol and ethoxy propanol; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. The concentration of the dry components in the solvent will depend on several factors such as the method of application. In general, the solids content of an antireflective composition varies from about 0.5 to 20 weight percent of the total weight of the antireflective composition, preferably the solids content varies from about 2 to 10 weight percent of the total weight of the antireflective composition.

A variety of photoresist compositions can be employed with the antireflective compositions of the invention, including positive-acting and negative-acting photoacid-generating compositions. Photoresists used with antireflective compositions of the invention typically comprise a resin binder and a photoactive component, typically a photoacid generator compound. Preferably the photoresist resin binder has functional groups that impart alkaline aqueous developability to the imaged resist composition. Generally particularly preferred photoresists for use with antireflective compositions of the invention are positive-acting and negative-acting chemically-amplified resists. A number of chemically-amplified resist compositions have been described, e.g., in U.S. Pat. Nos. 4,968,581; 4,883,740; 4,810,613; 4,491,628 and 5,492,793, all of which are incorporated herein by reference for their teaching of making and using chemically amplified positive-acting resists. A particularly preferred chemically amplified photoresist for use with an antireflective composition of the invention comprises in admixture a photoacid generator and a resin binder that comprises a copolymer containing both phenolic and non-phenolic units. For example, one preferred group of such copolymers has acid labile groups substantially, essentially or completely only on non-phenolic units of the copolymer. One especially preferred copolymer binder has repeating units x and y of the following formula:

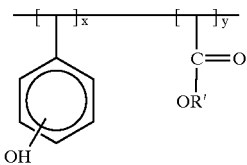

wherein the hydroxyl group be present at either the ortho, meta or para positions throughout the copolymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halogen (particularly F, Cl or Br), $C_{1-8}$ alkoxy, $C_{2-8}$ alkenyl, etc. The units x and y may be regularly alternating in the copolymer, or may be randomly interspersed through the polymer. Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R'—O—C(=O)—, moiety of the acrylate units serves as the acid labile groups of the resin and will undergo photoacid induced cleavage upon exposure of a coating layer of a photoresist containing the resin. Preferably the copolymer will have a Mw of from about 8,000 to about 50,000, more preferably about 15,000 to about 30,000 with a molecular weight distribution of about 3 or less, more preferably a molecular weight distribution of about 2 or less. Non-phenolic resins, e.g. a copolymer of an alkyl acrylate such as t-butylacrylate or t-butylmethacrylate and a vinyl alicyclic such as a vinyl norbornyl or vinyl cyclohexanol compound, also may be used as a resin binder in compositions of the invention. Such copolymers also may be prepared by such free radical polymerization or other known procedures and suitably will have a Mw of from about 8,000 to about 50,000, and a molecular weight distribution of about 3 or less. Additional preferred chemically-amplified positive resists are disclosed in U.S. Pat. No. 5,258,257 to Sinta et al.; U.S. Pat. No. 5,700,624 to Thackeray et al.; and U.S. Pat. No. 5,861,231 to Barclay et al.

The antireflective compositions of the invention also may be used with other positive resists, including those that contain resin binders that comprise polar functional groups such as hydroxyl or carboxylate and the resin binder is used in a resist composition in an amount sufficient to render the resist developable with an aqueous alkaline solution. Generally preferred resist resin binders are phenolic resins including phenol aldehyde condensates known in the art as novolak resins, homo and copolymers or alkenyl phenols and homo and copolymers of N-hydroxyphenyl-maleimides.

Preferred negative-acting resist compositions for use with an antireflective composition of the invention comprise a mixture of materials that will cure, crosslink or harden upon exposure to acid, and a photoacid generator.

Particularly preferred negative-acting resist compositions comprise a resin binder such as a phenolic resin, a crosslinker component and a photoactive component of the invention. Such compositions and the use thereof have been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycourils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycouril resins are sold by American Cyanamid under trade names Cymel 1170, 1171, 1172, Powderlink 1174, urea-based resins are sold under the trade names of Beetle 60, 65 and 80, and benzoguanamine resins are sold under the trade names Cymel 1123 and 1125.

Suitable photoacid generator compounds of resists used with antireflective compositions of the invention include the onium salts, such as those disclosed in U.S. Pat. Nos. 4,442,197, 4,603,101, and 4,624,912, each incorporated herein by reference; and non-ionic organic photoactive compounds such as the halogenated photoactive compounds as in U.S. Pat. No. 5,128,232 to Thackeray et al. and sulfonate photoacid generators including sulfonated esters and sulfonyloxy ketones. See *J. of Photopolymer Science and Technology*, 4(3):337–340 (1991), for disclosure of suitable sulfonate PAGS, including benzoin tosylate, t-butylphenyl alpha-(p-toluenesulfonyloxy)-acetate and t-butyl alpha-(p-toluenesulfonyloxy)-acetate. Preferred sulfonate PAGs are also disclosed in U.S. Pat. No. 5,344,742 to Sinta et al. The above camphorsulfonate PAGs 1 and 2 are also preferred photoacid generators for resist compositions used with the antireflective compositions of the invention, particularly chemically-amplified resists of the invention.

Photoresists for use with an antireflective composition of the invention also may contain other materials. For example, other optional additives include actinic and contrast dyes, anti-striation agents, plasticizers, speed enhancers, etc. Such optional additives typically will be present in minor concentration in a photoresist composition except for fillers and dyes which may be present in relatively large concentrations such as, e.g., in amounts of from 5 to 30 percent by weight of the total weight of a resist's dry components.

Antireflective compositions of the invention that include a low basicity crosslinker such as a suitable glycouril are particularly useful with photoresists that generate a strong acid photoproduct upon exposure such as triflic acid, camphor sulfonate or other sulfonic acid, or other acid having a pKa (25° C.) of about 2 or less. See the above-discussed published European Applications of the Shipley Company In use, an antireflective composition of the invention is applied as a coating layer to a substrate by any of a variety of methods such as spin coating. The antireflective composition in general is applied on a substrate with a dried layer thickness of between about 0.02 and 0.5 μm, preferably a dried layer thickness of between about 0.04 and 0.20 μm. The substrate is suitably any substrate used in processes involving photoresists. For example, the substrate can be silicon, silicon dioxide or aluminum-aluminum oxide microelectronic wafers. Gallium arsenide, ceramic, quartz or copper substrates may also be employed. Substrates used for liquid crystal display or other flat panel display applications are also suitably employed, for example glass substrates, indium tin oxide coated substrates and the like. Substrates for optical and optical-electronic devices (e.g. waveguides) also can employed.

If a crosslinking antireflective composition is employed, preferably applied the antireflective coating layer is cured before a photoresist composition is applied over the antireflective composition. Cure conditions will vary with the components of the antireflective composition. Thus, if the composition does not contain an acid or thermal acid generator, cure temperatures and conditions will be more vigorous than those of a composition containing an acid or acid generator compound. Typical cure conditions are from about 120° C. to 225° C. for about 0.5 to 40 minutes. Cure conditions preferably render the antireflective composition coating layer substantially insoluble to the photoresist solvent as well as an alkaline aqueous developer solution.

If a "multi-cure" method of the invention is employed, where a lower flow thermal treatment is employed followed by a higher crosslinking treatment, as discussed above, the applied ARC composition layer first will be subjected to a lower temperature resin "flow" planarizing thermal treatment that will vary the flow and crosslinking temperatures of the ARC composition. However, a suitable flow planarizing thermal treatment may be about 50° C. or 60° C. for at least about 1 to 2 minutes. Suitable flow planarizing treatments can be readily determined empirically for any particular ARC composition. Thereafter, the ARC composition layer can be treated with higher temperatures to crosslink the composition.

After such curing a photoresist is applied over the surface of the antireflective composition. As with application of the antireflective composition, the photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the antireflective composition layer and photoresist layer should occur.

The resist layer is then imaged with activating radiation through a mask in conventional manner. The exposure energy is sufficient to effectively activate the photoactive component of the resist system to produce a patterned image in the resist coating layer as well as activate the photoacid generator of at least a portion of the thickness of antireflective composition layer so that photogenerated acid from the PAG of the antireflective composition is present at the antireflective composition/resist coating layers interface. The exposure energy typically ranges from about 1 to 300 mJ/cm$^2$ and depending in part upon the exposure tool and the particular resist and resist processing that is employed. If the ARC also contains a photoacid generator to reduce undesired notching and footing, generally exposure doses used for typical imaging of a resist layer will be sufficient to photoactivate an effective amount of acid in the underlying antireflective composition layer.

The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to 160° C.

The exposed resist coating layer is then developed, preferably with an aqueous based developer such as an inorganic alkali exemplified by tetrabutyl ammonium hydroxide, sodium hydroxide, potassium hydroxide, sodium carbonate, sodium bicarbonate, sodium silicate, sodium metasilicate, aqueous ammonia or the like. Alternatively, organic developers can be used. In general, development is in accordance with art recognized procedures. Following development, a final bake of an acid-hardening photoresist is often employed at temperatures of from about 100 to 150° C. for several minutes to further cure the developed exposed coating layer areas.

The developed substrate may then be selectively processed on those substrates areas bared of photoresist, for example chemically etching or plating substrate areas bared of photoresist in accordance with procedures well known in the art. Suitable etchants include a hydrofluoric acid etching solution and a plasma gas etch such as an oxygen plasma etch. A plasma gas etch can remove the crosslinked antihalation coating layer.

All documents mentioned herein are incorporated herein by reference. The following non-limiting examples are illustrative of the invention.

EXAMPLE 1

Synthesis of ARC Polymer

9-Anthracenemethyl methacrylate (155.63 g), 2-hydroxyethyl methacrylate (65.07 g), and methyl methacrylate (65.62 g) were dissolved in 1850 g of ethyl lactate. The solution was degassed with a stream of dry nitrogen for 15 min. and heated to 50° C. The polymerization initiator [2,2'azobis(2-methylbutanenitrile)] (23.217 g) was dissolved in 110 g of ethyl lactate and this solution was rapidly added to the reaction flask; heating continued to 85° C. Heating at 85° C. was maintained for 24 hours. The solution was cooled to room temperature. The polymer product was isolated by precipitation into 12 L of deionized water and dried in vacuum. Yield 100%. Molecular weight ($M_w$) (vs. polystyrene standards) 8355; Tg 103° C.

EXAMPLE 2

Synthesis of Low Mw ARC Polymer with Chain Transfer Agent

9-Anthracenemethyl methacrylate (15.56 g), 2-hydroxyethyl methacrylate (6.51 g), and methyl methacrylate (6.59 g) were dissolved in 200 g of ethyl lactate, t-Dodecylthiol (2.01 g) was added as a chain transfer agent. The solution was degassed with a stream of dry nitrogen for 10 min. and heated to 50° C.; 1.015 g of the polymerization initiator [2,2'azobis(2-methylbutanenitrile)] was added and heating continued to 85° C. The solution was heated at 85° C. for 24 hours. The solution was cooled to room temperature and diluted with 50 g additional ethyl lactate. The polymer product was isolated by precipitation into 2 L of hexane and dried in vacuum. Yield 86%. Molecular weight ($M_w$) (vs. polystyrene standards) 6304; Tg 101° C.

EXAMPLE 3

Synthesis of Low Mw ARC Polymer with Chain Transfer Agent

9-Anthracenemethyl methacrylate (15.58 g), 2-hydroxyethyl methacrylate (6.51 g), and methyl methacrylate (6.58 g) were dissolved in 200 g of ethyl lactate, t-Dodecylthiol (4.06 g) was added as a chain transfer agent. The solution was degassed with a stream of dry nitrogen for 10 min. and heated to 50° C.; 1.012 g of the polymerization initiator [2,2'azobis(2-methylbutanenitrile)] was added and heating continued to 85° C. The solution was heated at 85° C. for 24 hours. The solution was cooled to room temperature. The reaction solution was precipitated into 800 mL of t-butylmethylether. The mixture was filtered, the collected liguors were concentrated, and the resultant oil was precipitated into 300 mL heptane and dried in vacuum. Yield 21%. Molecular weight ($M_w$) (vs. polystyrene standards) 2337; Tg 60° C.

EXAMPLE 4

Synthesis of ARC Polymer with Tg-Lowering Monomer

9-Anthracenemethyl methacrylate (33.21 g), HEMA-5 (i.e. $CH_2=C(CH_3)COO(CH_2CH_2O)_4CH_2CH_2OH$) (15.36 g), and methyl methacrylate (8.00 g) were dissolved in 430 g of ethyl lactate. The solution was degassed with a stream of dry nitrogen for 10 min. and heated to 45 C. The polymerization initiator [2,2'azobis(2,4-dimethylpentanenitrile)] (5.58 g) was added and heating continued to 85° C. Heating at 85° C. was maintained for 24 hours. The solution was cooled to room temperature. The polymer product was isolated by precipitation into 2.5 L of deionized water and dried in vacuum. Yield 79%. Molecular weight ($M_w$) (vs. polystyrene standards) 4963; Tg 50° C.

EXAMPLE 5

Preparation and Processing of Low Molecular Weight Resin ARC Composition of the Invention A preferred ARC composition of the invention having a low molecular polymer is suitably prepared by admixing the following components, with component amounts expressed as parts by weight based on total solids (all components expect solvent carrier) of the liquid antireflective coating composition:

1) Resin: 88% of terpolymer of Example 1 above
2) Crosslinker: 11% Powderlink 1174 (American Cyanamid)
3) Photoacid generator: 0.5% di-t-butyl diphenyl iodonium camphorsulfonate
4) Acid: 0.3% p-toluenesulfonic acid monohydrate The ARC composition is formulated in a solvent of ethyl lactate. The liquid ARC composition is spin coated onto a silicon wafer substrate and then thermally cured for 60 seconds at 175° C. That cured ARC layer is overcoated with a positive-acting photoresist UV5 available from the Shipley Company (Marlborough, Mass.). The resist layer is soft-baked on a vacuum hot plate, exposed to patterned radiation, post-exposure baked and then developed with an alkaline aqueous solution. The underlying ARC layer is etched with an oxygen/fluorocarbon plasma, and the based substrate surface plasma etched.

EXAMPLE 6

Preparation and Processing of ARC Composition of the Invention Containing Plasticizer A preferred ARC composition of the invention having a plasticizer is suitably prepared by admixing the following components, with component amounts expressed as parts by weight based on total solids (all components expect solvent carrier) of the liquid antireflective coating composition:
1) Resin: 68% of terpolymer of Example 1 above
2) Plasticizer: 20% of 2,6-bis(2',4'-dihydroxybenzyl)4-methylphenol
3) Crosslinker: 11% Powderlink 1174 (American Cyanamid)
4) Photoacid generator: 0.5% di-t-butyl diphenyl iodonium camphorsulfonate
5) Acid: 0.3% p-toluenesulfonic acid monohydrate The ARC composition is formulated in a solvent of ethyl lactate. The liquid ARC composition is spin coated onto a silicon wafer substrae and then thermally cured for 60 seconds at 175° C. That cured ARC layer is overcoated with a positive-acting photoresist UV5 available from the Shipley Company (Marlborough, Mass.). The resist layer is soft-baked on a vacuum hot plate, exposed to patterned radiation, post-exposure baked and then developed with an alkaline aqueous solution. The underlying ARC layer is etched with an oxygen/fluorocarbon plasma, and the based substrate surface plasma etched.

EXAMPLE 7

Two Cure System

An ARC composition of the invention was prepared that contained the following components in admixture: 95.5 weight % of propylene glycol monomethyl ether solvent; and 4.5 weight % solids that consisted of 86.95 weight % of terpolymer (ANTMA/HEMA/MMA) having an Mw~12000, 11 weight % of Powderlink 1174 crosslinker, 0.8 weight % of a surface leveling agent (FC430 from 3M Co.), 0.5 weight % of PAG of di tert-butyl phenyl iodonium camphorsulfonate, and 0.75% Nacure X49 (King Industries) thermal acid generator.

This ARC composition was spin coated at 2500 rpm on wafer substrates to 1200 angstroms thickness, then cured at 200° C. This gave acceptable resist profiles over it, exposed at 9.2 mJ/cm2 with a 0.53NA lens with 248 nm radiation.

Additional tests with ARCs of the invention containing a thermal acid generator of Nacure X49 cross-linked only lightly (90% loss in solvent—ethyl lactate) after a 125° C. cure.

The foregoing description of the invention is merely illustrative thereof, and it is understood that variations and modifications can be effected without departing from the scope or spirit of the invention as set forth in the following claims.

What is claimed is:

1. A coated substrate comprising:

a substrate having thereon:

a coating layer of an antireflective composition, the antireflective composition comprising a plasticizer compound and a polymer having a molecular weight ($M_w$) of about 8,000 or less, wherein the plasticizer compound has a Mw of about 2,000 or less and is chosen from among a phenyl or benzyl substituted anthracene compound, a compound of having multiple aryl substitution, and a phenolic compound; and a coating layer of a chemically-amplified positive photoresist composition over the antireflective layer.

2. The substrate of claim 1 wherein the antireflective layer is crosslinked.

3. The substrate of claim 2 wherein the antireflective composition comprises a crosslinker compound which is a material distinct from the plasticizer compound and the polymer.

4. The substrate of claim 1 wherein the polymer has a molecular weight ($M_w$) of about 6,000 or less.

5. The substrate of claim 1 wherein the polymer has a molecular weight ($M_w$) of about 5,000 or less.

6. The substrate of claim 1 wherein the polymer has a molecular weight ($M_w$) of about 3,000 or less.

7. The substrate of claim 1 wherein the polymer comprises anthracenyl units.

8. The substrate of claim 1 wherein the polymer comprises phenyl units.

9. The substrate of claim 1 wherein the plasticizer compound is a non-polymeric compound.

10. A coated substrate comprising:

a substrate having thereon:

a coating layer of an antireflective composition, the antireflective composition comprising a plasticizer compound that has a Mw of about 2,000 or less and is chosen from among a phenyl or benzyl substituted anthracene compound, a compound of having multiple aryl substitution, and a phenolic compound; and a coating layer of a chemically-amplified positive photoresist composition over the antireflective layer.

11. The substrate of claim 10 wherein the plasticizer compound is a non-polymeric compound.

12. The substrate of claim 10 wherein the antireflective composition further comprises a resin.

13. The substrate of claim 12 wherein the resin comprises anthracenyl units.

14. The substrate of claim 12 wherein the resin comprises phenyl units.

15. The substrate of claim 12 wherein the antireflective composition further comprises a crosslinker.

16. The substrate of claim 15 wherein the crosslinker is an amine-based material.

17. The substrate of claim 10 wherein the antireflective composition layer is crosslinked.

18. The substrate of claim 10 wherein the substrate is a microelectronic wafer.

* * * * *